US012680173B2

(12) United States Patent
Chan et al.

(10) Patent No.: US 12,680,173 B2
(45) Date of Patent: Jul. 14, 2026

(54) PROCESS AND APPARATUS TO REMOVE METAL-CONTAINING FILMS FROM A CHAMBER

(71) Applicant: Applied Materials, Inc., Santa Clara, CA (US)

(72) Inventors: Kelvin Chan, San Ramon, CA (US); Ruiying Hao, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 407 days.

(21) Appl. No.: 17/869,412

(22) Filed: Jul. 20, 2022

(65) Prior Publication Data

US 2023/0064100 A1 Mar. 2, 2023

Related U.S. Application Data

(60) Provisional application No. 63/239,774, filed on Sep. 1, 2021.

(51) Int. Cl.
*C23F 1/44* (2006.01)
*C23C 16/455* (2006.01)

(52) U.S. Cl.
CPC .......... *C23F 1/44* (2013.01); *C23C 16/45565* (2013.01)

(58) Field of Classification Search
None
See application file for complete search history.

(56) References Cited

U.S. PATENT DOCUMENTS

| | | | |
|---|---|---|---|
| 6,010,966 A * | 1/2000 | Ionov | H01L 21/32136 |
| | | | 438/719 |
| 2016/0093505 A1 | 3/2016 | Chen et al. | |
| 2018/0327901 A1* | 11/2018 | Kishi | C23C 16/4401 |
| 2019/0214230 A1* | 7/2019 | Cui | H01L 21/28518 |
| 2019/0228970 A1 | 7/2019 | Yang et al. | |
| 2020/0051807 A1* | 2/2020 | Singhal | H01L 21/31122 |

FOREIGN PATENT DOCUMENTS

JP 2016184725 A 10/2016

OTHER PUBLICATIONS

International Search Report and Written Opinion from PCT/US2022/038891 dated Nov. 23, 2022, 9 pgs.
International Preliminary Report on Patentabililty from PCT/US2022/038891 dated Mar. 14, 2024, 6 pgs.
Official Letter from Taiwan Patent Application No. 111129286, dated Nov. 8, 2024, 13 pages.

* cited by examiner

*Primary Examiner* — Stephanie P Duclair
(74) *Attorney, Agent, or Firm* — Schwabe, Williamson & Wyatt, P.C.

(57) ABSTRACT

Embodiments disclosed herein include methods for removing a metal containing layer from a chamber of a tool. In an embodiment, the method comprises generating a remote plasma in the tool. The method may continue with flowing reactive species from the remote plasma into the chamber, and flowing a hydrocarbon gas into the chamber. In an embodiment, the method may include reacting the reactive species with the hydrocarbon gas within the chamber. In an embodiment, the method may further comprise etching the metal-containing material in the chamber.

11 Claims, 5 Drawing Sheets

101

112 111

| | |
|---|---|
| ■ | 325 |
| ▨ | 323 |
| ▦ | 320 |
| ▨ | 318 |
| ▨ | 315 |
| ▨ | 313 |
| ▨ | 310 |
| | 308 |
| | 305 |
| □ | 303 |

111

101

112

| | |
|---|---|
| ■ | 426 |
| ▨ | 381 |
| ▦ | 335 |
| ▨ | 290 |
| ▨ | 244 |
| ▨ | 199 |
| ▨ | 153 |
| | 108 |
| | 62 |
| □ | 17 |

470

471 GENERATING A REMOTE PLASMA

472 FLOWING REACTIVE SPECIES FROM THE REMOTE PLASMA INTO A CHAMBER THROUGH FIRST CHANNELS OF A DUAL CHANNEL SHOWERHEAD

473 INJECTING A HYDROCARBON GAS INTO THE CHAMBER THROUGH SECOND CHANNELS OF THE DUAL CHANNEL SHOWERHEAD

474 REACTING THE REACTIVE SPECIES WITH THE HYDROCARBON GAS WITHIN THE CHAMBER

475 ETCHING A MATERIAL IN THE CHAMBER

PROCESS AND APPARATUS TO REMOVE METAL-CONTAINING FILMS FROM A CHAMBER

CROSS-REFERENCE TO RELATED APPLICATIONS

This application claims the benefit of U.S. Provisional Application No. 63/239,774, filed on Sep. 1, 2021, the entire contents of which are hereby incorporated by reference herein.

BACKGROUND

1) Field

Embodiments of the present disclosure pertain to the field of semiconductor processing and, in particular, to methods and apparatuses for removing metal-containing films from a chamber.

2) Description of Related Art

In many etching processes redeposition of volatile species may occur. The redeposition reduces the etch rate since material is added back to the surface while the primary etching reaction is ongoing. Additionally, the redeposition may be non-uniform across the substrate. This results in non-uniform etching profiles. For example, the redeposition may occur more along the edge of the substrate than in the middle of the substrate. In the particular instance of a hydrogen etch of a metal surface (e.g., Sn), $Sn+4H \rightarrow SnH_4$ where $SnH_4$ is volatile. The $SnH_4$ may redeposit in accordance with the equations $SnH_4 \rightarrow Sn+2H_2$ and $SnH_4+ 2H_2O \rightarrow SnO_2+4H_2$.

SUMMARY

Embodiments disclosed herein include methods for removing a metal containing layer from a chamber of a tool. In an embodiment, the method comprises generating a remote plasma in the tool. The method may continue with flowing reactive species from the remote plasma into the chamber, and flowing a hydrocarbon gas into the chamber. In an embodiment, the method may include reacting the reactive species with the hydrocarbon gas within the chamber. In an embodiment, the method may further comprise etching the metal-containing material in the chamber.

In an embodiment, a tool configured for implementing methods disclosed herein is provided. In an embodiment, the tool comprises a remote plasma source, a chamber coupled to the remote plasma source, and a dual channel showerhead between the remote plasma source and the chamber. In an embodiment, first channels are fluidically coupled to the remote plasma source, and second channels are fluidically coupled to a gas source.

In an embodiment, a method for removing a metal-containing material from a chamber of a tool may comprise generating a remote plasma using a first source gas comprising hydrogen. In an embodiment, the method may continue with flowing reactive species from the remote plasma into a chamber through first channels of a dual channel showerhead. The method may further continue with injecting a second source gas comprising a hydrocarbon into the chamber through second channels of the dual channel showerhead. In an embodiment, the method may continue with reacting the reactive species with the second source gas to form $C_xH_Y$ radicals within the chamber. In an embodiment, the method may continue with etching the metal-containing material in the chamber, wherein etch byproducts comprise $C_XH_YM$, wherein M is a metal.

DETAILED DESCRIPTION

Methods and apparatuses for removing metal-containing films from a chamber are described herein. In the following description, numerous specific details are set forth in order to provide a thorough understanding of embodiments of the present disclosure. It will be apparent to one skilled in the art that embodiments of the present disclosure may be practiced without these specific details. In other instances, well-known aspects, such as integrated circuit fabrication, are not described in detail in order to not unnecessarily obscure embodiments of the present disclosure. Furthermore, it is to be understood that the various embodiments shown in the Figures are illustrative representations and are not necessarily drawn to scale.

As noted above, etching material in a processing chamber may sometimes result in a non-uniform etch profiles. For example, redeposition of etch byproducts may result in a non-uniform etch rate across the surface of a substrate. In a particular instance, the etch rate along the edges of the substrate may be slower than the etch rate at the center of the substrate. In some instances, the etch rate along the edge may even be negative. That is, more material may be deposited along the edge than is removed.

Figure 1A:
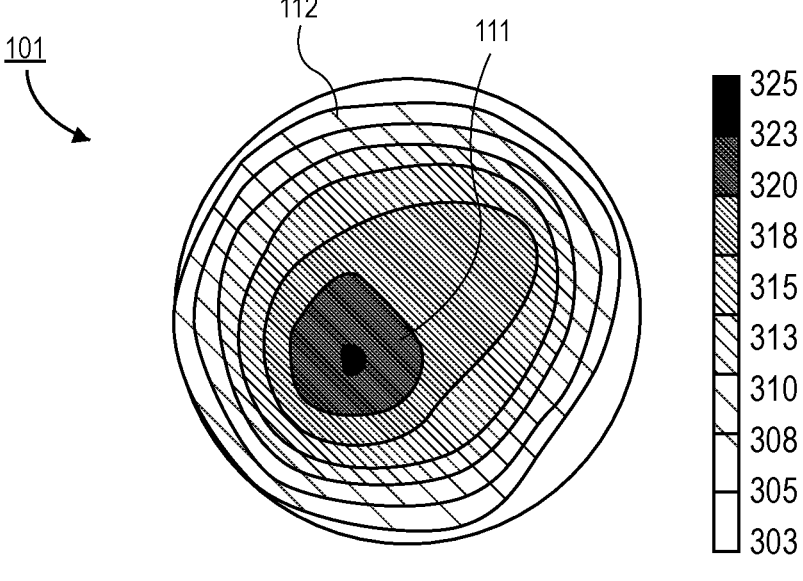
FIG. 1A is a plan view heat map of a thickness of a metal layer over a substrate in an as deposited state.
Figure 1B:
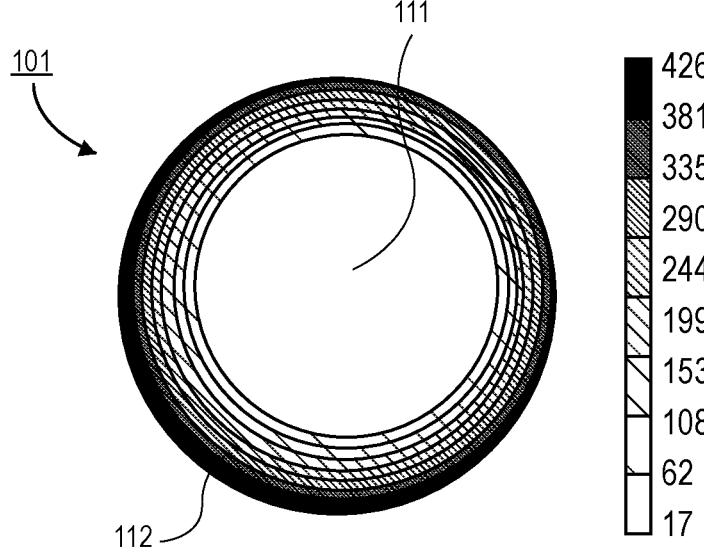
FIG. 1B is a plan view heat map of a thickness of a metal layer after an etching process that includes redeposition along the edge of the substrate.

An example of such redeposition is shown in FIGS. 1A and 1B. In FIG. 1A the heat map shows the as deposited thickness of a metal-containing layer on a substrate 101. As shown, the center region 111 may be slightly thicker than the edge region 112. Though, it is to be appreciated that the thickness of the center region 111 may be similar to the thickness of the edge region 112. For example, the metal-containing layer may comprise Sn, though similar redeposition problems may be present with other metal compositions.

Referring now to FIG. 1B, the heat map of the thickness of the metal-containing layer on a substrate after an etching process has been implemented is shown. The center region 111 exhibits a significant reduction in thickness of the metal-containing layer. However, the edge region 112 exhibits an overall increase in the thickness of the metal-containing layer. The increase in thickness may be the result of redeposition of the metal. As a result, the etch profile is non-uniform and can lead to non-conforming substrates that need to be reworked or are otherwise non-satisfactory for continued processing.

Accordingly, embodiments disclosed herein include methods and apparatuses that are designed to reduce or eliminate the redeposition of etch byproducts on the substrate. Particularly, embodiments include the injection of hydrocarbons into the chamber. The hydrocarbons react with radical species from a remote plasma source in order to create additional reaction pathways that render etch byproducts less reactive and less likely to redeposit. Without the presence of the hydrocarbon gas, the primary reaction pathway for etching a metal-containing layer is the reaction of radical H with the metal M to form MH. However, the MH product is susceptible to decomposition back to M and redeposition back onto the surface. In contrast, when hydrocarbons are injected into the chamber, the radical species from the plasma react with the hydrocarbon gas to form $C_xH_y$ radicals. The $C_xH_y$ radicals participate in the etching (or cleaning) process to form $C_xH_yM$ moieties. These moieties are less likely to self-decompose to M or react with $H_2O$ to form $MO_2$. As such, the etch profile is more consistent across the surface of the substrate since there is limited redeposition.

In some embodiments described herein, the etching process is used to etch a metal layer over a substrate. However, it is to be appreciated that the layer may comprise a metal and other elements. For example, the metal-containing layer may be an oxide, a nitride, a carbide, an oxycarbide, an oxynitride, an oxycarbonitride, or a carbonitride. Additionally, the layer being removed may be on surfaces other than the substrate. For example, chamber cleaning operations may also utilize embodiments disclosed herein in order to clean interior surfaces of the chamber.

In an embodiment, the hydrocarbons are kept isolated from the radical species until reaching the chamber. For example, separate fluidic paths through a showerhead allow for the segregation of the two sources. In an embodiment, a first path through the showerhead may fluidically couple a remote plasma source to the chamber, and a second path through the showerhead may fluidically couple a hydrocarbon source to the chamber. Since there are two isolated paths through the showerhead, the showerhead may sometimes be referred to as a dual channel showerhead.

Figure 2:
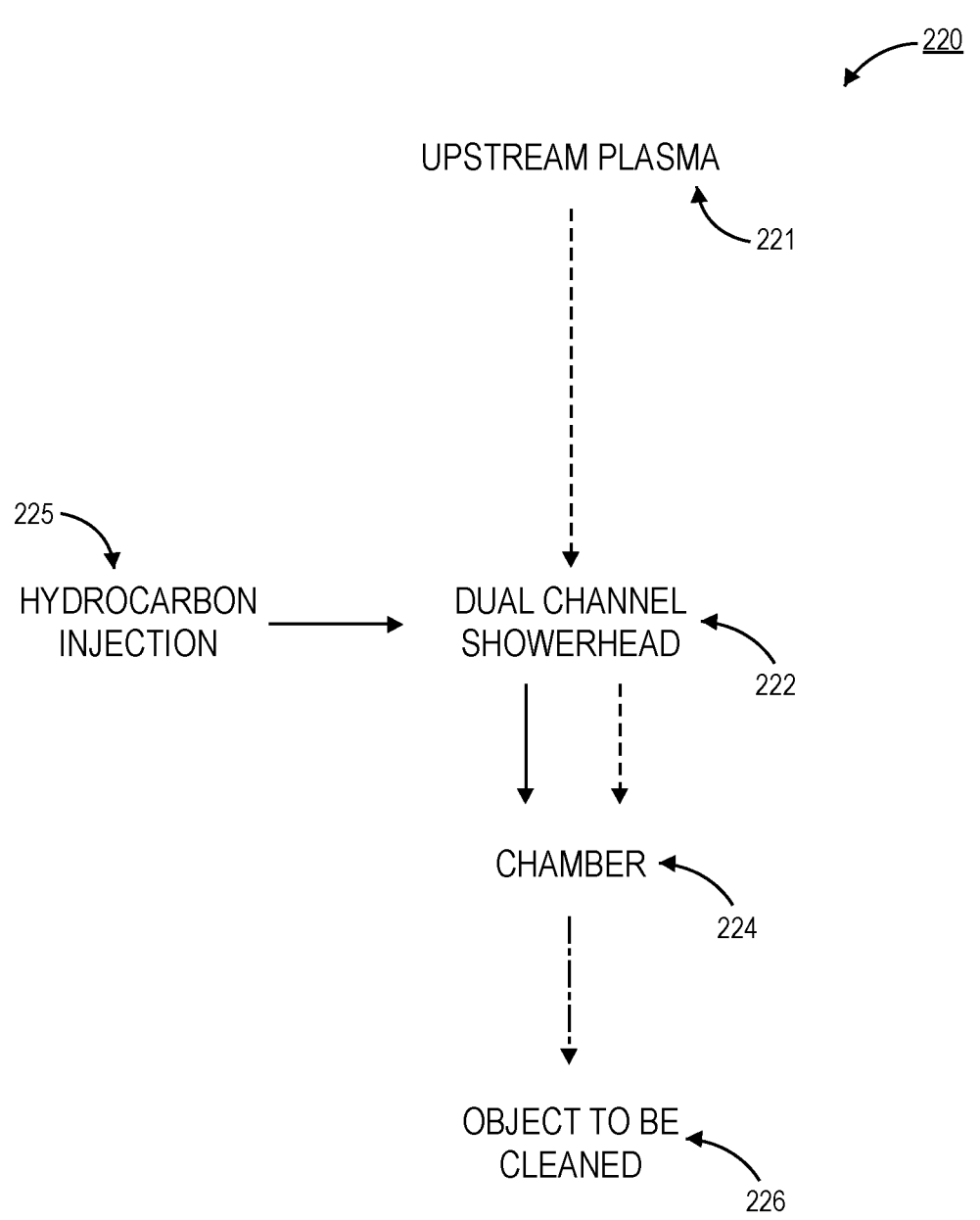
FIG. 2 is a schematic illustration of a tool that uses a remote plasma and a hydrocarbon gas to etch an object within a chamber with minimal redeposition of etch byproducts, in accordance with an embodiment.

Referring now to FIG. 2, a schematic of the processing system 220 is shown, in accordance with an embodiment. As shown, an upstream plasma 221 is provided at a first end of the system 220. The upstream plasma 221 may be a remote plasma source. In an embodiment, the upstream plasma 221 may be a capacitively coupled plasma, an inductively coupled plasma, a TCTP, or a microwave plasma source. The upstream plasma 221 may be coupled to a dual channel showerhead 222. As such, radical species (sometimes called reactive species) generated in the upstream plasma 221 are propagated to the dual channel showerhead 222, and ultimately into the chamber 224.

In an embodiment, a hydrocarbon injection 225 is fluidically coupled to the dual channel showerhead 222. The hydrocarbons are then directed into the chamber 224. As indicated by the schematic, the radical species and the hydrocarbons remain separated until reaching the chamber 224. At the chamber 224, the radical species and the hydrocarbons react with each other in order to provide species that mitigate redeposition of etched material from the object to be cleaned 226. For example, radical H may react with the hydrocarbon gas to form $C_xH_y$ radicals. The $C_xH_y$ radicals can then react with the metal of the metal-containing layer to form $C_xH_yM$ (where M is a metal). The $C_xH_yM$ is less likely to redeposit than other etch byproducts, such as HM.

In an embodiment, the object to be cleaned 226 may be any feature within a chamber 224. In some embodiments, the object to be cleaned 226 is a layer on a substrate that is within the chamber 224. For example, a metal-containing layer on a substrate within the chamber 224 may be etched by the radical species. In other embodiments, the object to be cleaned 226 comprises interior surfaces of the chamber 224.

Figure 3:
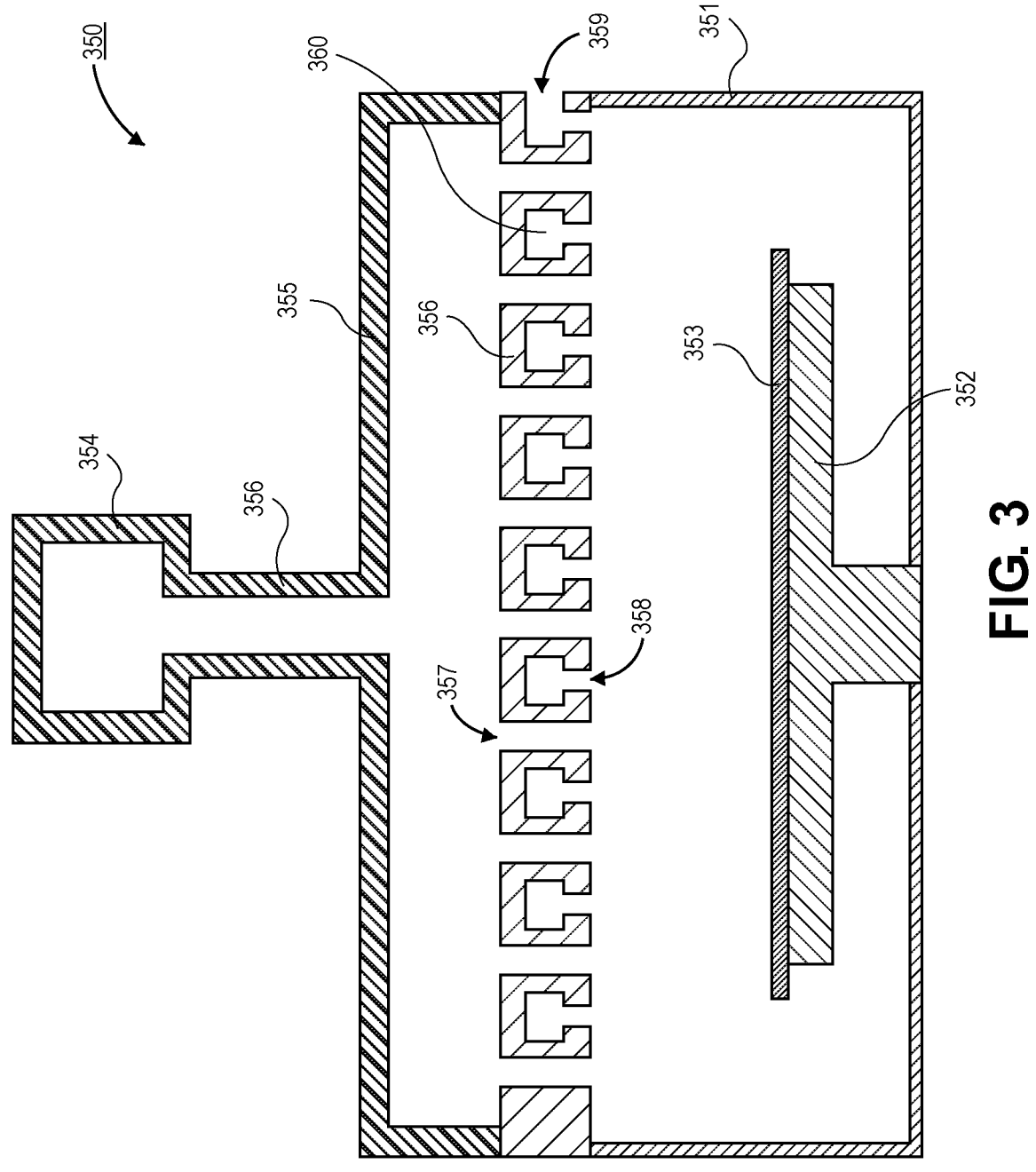
FIG. 3 is a cross-sectional illustration of a tool that includes a dual channel showerhead in order to keep the reactive species from a remote plasma separate from the hydrocarbon gas until reaching the chamber, in accordance with an embodiment.

Referring now to FIG. 3, a cross-sectional illustration of a tool 350 is shown, in accordance with an embodiment. In an embodiment, the tool 350 may be suitable for implementing a process for etching a material layer on an object, such as processes described in greater detail below. In an embodiment, the tool 350 comprises a chamber 351. The chamber 351 may have a pedestal 352. A substrate 353 may be supported on the pedestal 352. The pedestal 352 may be configured to secure the substrate 353 (e.g., with vacuum chucking, electrostatic chucking, or the like).

In an embodiment, the substrate 353 may be a semiconductor substrate. In some embodiments, the substrate 353 may be a wafer, such as a 300 mm wafer, a 450 mm wafer, or any sized wafer. In other embodiments, the substrate 353 may be a non-semiconductor substrate. For example, the substrate 353 may be a glass substrate in some embodiments. The substrate 353 may also have a form factor different than a typical wafer. For example, a rectangular glass substrate 353 may be used in some embodiments. In an embodiment, a material layer may be provided on the surface of the substrate 353. The material layer may be the object that is etched in some embodiments. Additionally, while shown as having a substrate 353 in the chamber 351, it is to be appreciated that cleaning (or etching) processes may be implemented without a substrate 353 in the chamber 351. For example, chamber cleaning operations to clean the interior surfaces of the chamber 351 may be implemented without a substrate 353 in the chamber 351.

In an embodiment, the tool 350 may further comprise a remote plasma source 354. The remote plasma source 354 may be any suitable type of plasma source. For example, the remote plasma source 354 may be a capacitively coupled plasma, an inductively coupled plasma, a TCTP, or a microwave plasma source. In an embodiment, the remote plasma source 354 is fluidically coupled to a plenum 355 by a tube 356. The plenum 355 is attached to a showerhead 356. In an embodiment, radical species from the remote plasma source 354 propagate down the tube 356 and pass through first channels 357 in the showerhead 356.

In an embodiment, the showerhead 356 may be a dual channel showerhead 356. The first channels 357 may pass from a top surface of the showerhead 356 to a bottom surface of the showerhead 356. The second channels 358 may pass partially through a thickness of the showerhead 356. For example, an inlet 359 may be provided along an edge of the showerhead 356. The inlet 359 is coupled to an interior channel 360. The second channels 358 then extend down through the showerhead 356 from the interior channel 360. Accordingly, gas provided in the inlet 359 will not mix with the radical species from the remote plasma source 354 until both reach the chamber 351.

Figure 4:
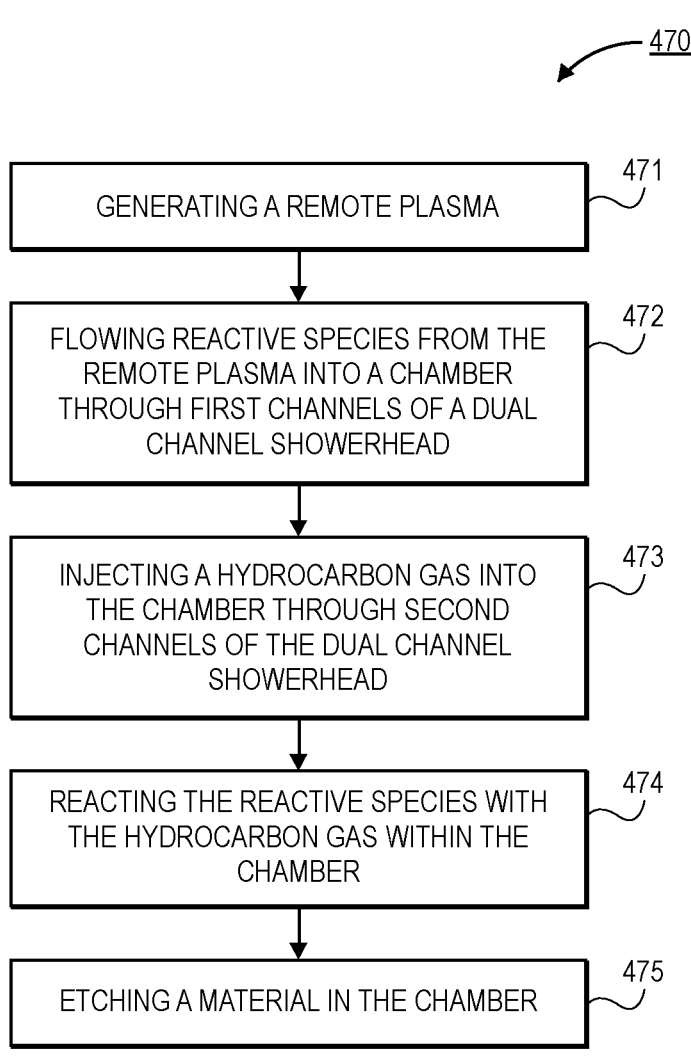
FIG. 4 is a flow diagram of a process for cleaning an object in a chamber using a remote plasma and a hydrocarbon gas to minimize or eliminate byproduct redeposition, in accordance with an embodiment.

Referring now to FIG. 4, a flow diagram of a process 470 for etching a material in a chamber is shown, in accordance with an embodiment. In an embodiment, the material in the chamber may be a layer on substrate. In other embodiments, the material in the chamber may be a redeposition layer on interior surfaces of the chamber. In a particular embodiment, the material to be removed comprises a metal. For example, the material to be removed may include B, Al, Ga, In, Sn, Zn, As, Cd, Ge, Si, alloys thereof, and the like. In some embodiments, the material to be removed may include a metal oxide, a metal nitride, a metal carbide, a metal oxycarbide, a metal oxynitride, a metal oxycarbonitride, or a metal carbonitride.

In an embodiment, process 470 may begin with operation 471, which comprises generating a remote plasma. In an embodiment, the remote plasma may be provided in a remote plasma source, similar to the remote plasma source 354 described in greater detail above. In an embodiment, the source gas for the remote plasma may comprise hydrogen. For example $H_2$ may be the source gas. In other embodiments, one or more of $H_2$, $NH_3$, and $NF_3$ may be used as the source gas. Additional gasses may also be used to generate the plasma. For example, inert gasses (e.g., Ar or He) may be used to form the plasma. Additionally, $O_2$ and/or $N_2O$ may be used to stabilize the plasma. In embodiments where $O_2$ and/or $N_2O$ is used, a flow rate of $H_2$ (or the flow rate of the combination of one or more of $H_2$, $NH_3$, and $NF_3$) may be approximately 150 times or more the flowrate of the $O_2$ and/or $N_2O$. For example, the flowrate of the $O_2$ and/or $N_2O$ may be approximately 30 sccm and the flowrate of $H_2$ may be approximately 4500 sccm.

In an embodiment, the process 470 may continue with operation 472, which comprises flowing reactive species from the remote plasma into a chamber through first channels of a dual channel showerhead. In an embodiment, the reactive species may include one or more of H, $NH_X$, N, $NF_X$, and F. The reactive species may propagate through a tube to a plenum above the dual channel showerhead, and then pass through first channels through the dual channel showerhead. The first channels may be substantially similar to the first channels 357 described in greater detail above. That is, the first channels 357 may pass from a top surface of the showerhead to the bottom surface of the showerhead.

In an embodiment, the process 470 may continue with operation 473, which comprises injecting a hydrocarbon gas into the chamber through second channels of the dual channel showerhead. In an embodiment, the hydrocarbon gas may include one or more of alkanes, alkenes, alkynes, and aromatic hydrocarbons. The second channels may be substantially similar to the second channels 358 described in greater detail above. That is, the second channels may be fluidically isolated from the first channels. As such, the reactive species remain isolated from the hydrocarbon gas until both reach the interior of the chamber. While shown sequentially in the flow diagram, it is to be appreciated that operation 472 and operation 473 may be carried out at the same time. That is, both the reactive species and the hydrocarbon gas may be provided into the chamber at substantially the same time.

In an embodiment, process 470 may continue with operation 474, which comprises reacting the reactive species with the hydrocarbon gas within the chamber. Once both reactive species and the hydrocarbon gas reach the chamber, the two will begin reacting with each other due to the reactive nature of the reactive species. In a particular embodiment, the radical H reacts with the hydrocarbon gas to form $C_XH_Y$ radicals.

In an embodiment, process 470 may continue with operation 475, which comprises etching a metal-containing material in the chamber. In an embodiment, the $C_XH_Y$ radicals may participate in the etching of the material. The presence of $C_XH_Y$ radicals provides an alternative reaction pathway that renders the etch byproduct less reactive and less likely to redeposit. For example, in the case of a Sn-containing material, radical H reacts with the Sn to form SnH. However, SnH is more likely to self-decompose to Sn (and redeposit on the substrate). In contrast, radical $C_XH_Y$ reacts with Sn to form $C_XH_YSn$ moieties, which are less likely to self-decompose to Sn or react with $H_2O$ to form $SnO_2$. As such, the removal of the metal-containing material is more uniform and more effective since the etching does not need to compete with as much redeposition.

Figure 5:
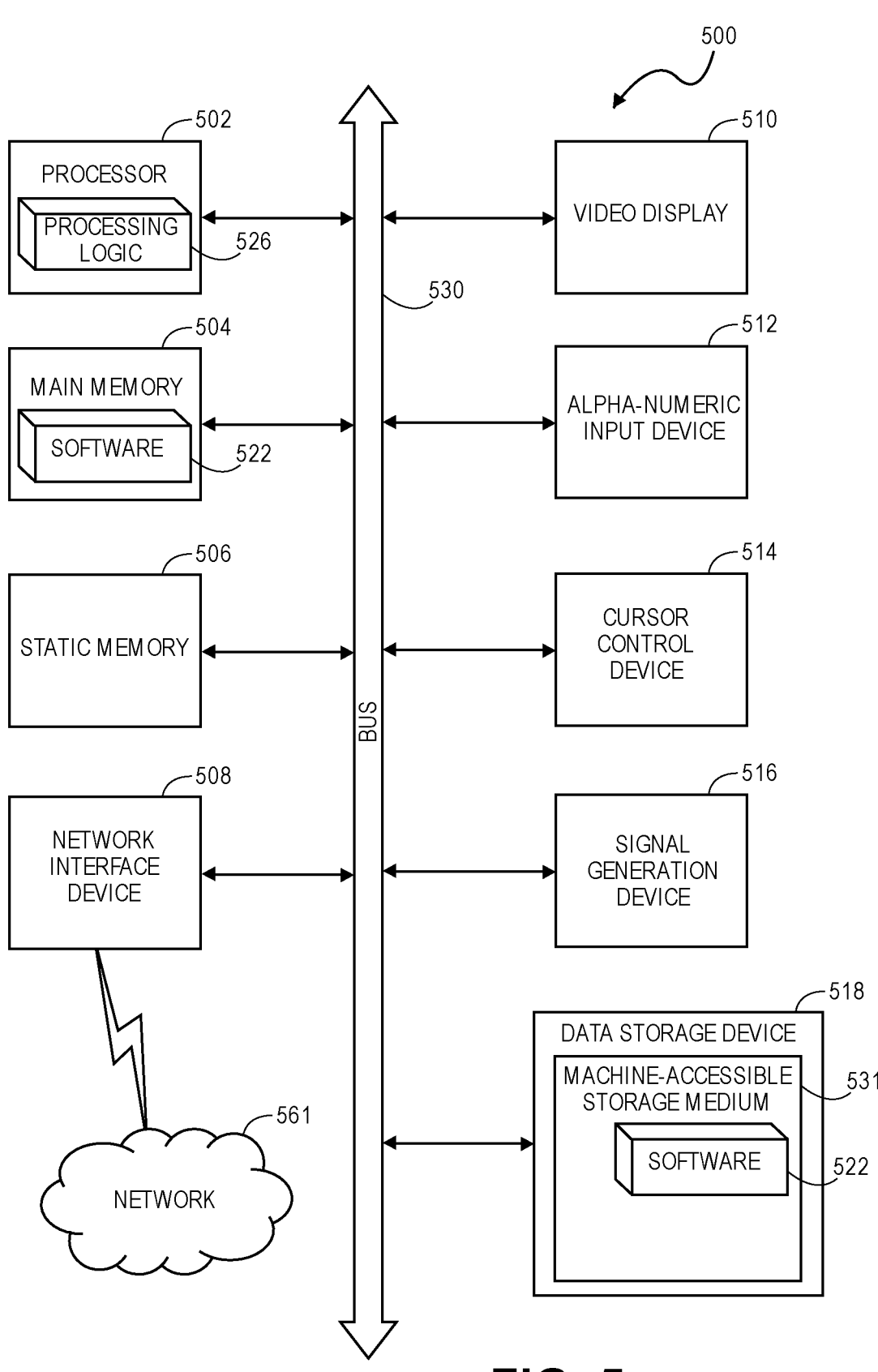
FIG. 5 illustrates a block diagram of an exemplary computer system, in accordance with an embodiment of the present disclosure.

FIG. 5 illustrates a diagrammatic representation of a machine in the exemplary form of a computer system 500 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), MRAM, etc.), and a secondary memory 518 (e.g., a data storage device), which communicate with each other via a bus 530.

Processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 502 may also be one or more special-purpose processing devices such as an application specific integrated circuit (ASIC), a field programmable gate array (FPGA), a digital signal processor (DSP), network processor, or the like. Processor 502 is configured to execute the processing logic 526 for performing the operations described herein.

The computer system 500 may further include a network interface device 508. The computer system 500 also may include a video display unit 510 (e.g., a liquid crystal display (LCD), a light emitting diode display (LED), or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium (or more specifically a computer-readable storage medium) 532 on which is stored one or more sets of instructions (e.g., software 522) embodying any one or more of the methodologies or functions described herein. The software 522 may also reside, completely or at least partially, within the main memory 504 and/or within the processor 502 during execution thereof by the computer system 500, the main memory 504 and the processor 502 also constituting machine-readable storage media. The software 522 may further be transmitted or received over a network 520 via the network interface device 508.

While the machine-accessible storage medium 532 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a method of etching a metal-containing material in a chamber using a remote plasma and a hydrocarbon gas. The method includes forming radical species with a remote plasma source, reacting the radical species with a hydrocarbon gas in a chamber, and etching the metal-containing material in the chamber. In an embodiment, the etching results in the formation of a $C_X H_Y M$ etch byproduct (where M is a metal) that is less likely to redeposit than an HM byproduct.

Thus, methods for etching a metal-containing material with a remote plasma and a hydrocarbon gas have been disclosed.

What is claimed is:

1. A method for removing a metal-containing material from a chamber of a tool, comprising:

generating a remote plasma in the tool;

flowing reactive species from the remote plasma into the chamber, wherein a source gas for the remote plasma comprises hydrogen and oxygen;

flowing a hydrocarbon gas into the chamber, wherein the hydrocarbon gas comprises one or more of an alkene, an alkyne, or an aromatic hydrocarbon;

reacting the reactive species with the hydrocarbon gas within the chamber; and etching the metal-containing material in the chamber, wherein the metal-containing material comprises one or more of indium, tin, zinc or cadmium.

2. The method of claim 1, wherein the reactive species passes through first channels of a showerhead, and wherein the hydrocarbon gas passes through second channels of the showerhead.

3. The method of claim 2, wherein the reactive species and the hydrocarbon gas do not mix until reaching the chamber.

4. The method of claim 1, wherein a flowrate of hydrogen is approximately 150 times or more than a flowrate of oxygen.

5. The method of claim 1, wherein reacting the reactive species with the hydrocarbon gas results in the formation of $C_X H_Y$ radicals, and wherein etching the metal-containing material results in the formation of $C_X H_Y M$ byproducts, wherein M is a metal.

6. The method of claim 1, wherein the metal-containing material is an oxide, a nitride, a carbide, an oxycarbide, an oxynitride, an oxycarbonitride, or a carbonitride.

7. The method of claim 1, wherein the metal-containing material is a layer on a substrate.

8. The method of claim 1, wherein the metal-containing material comprises tin.

9. A method for removing a metal-containing material from a chamber of a tool, comprising:

generating a remote plasma using a first source gas comprising hydrogen;

flowing reactive species from the remote plasma into a chamber through first channels of a dual channel showerhead, wherein a source gas for the remote plasma comprises hydrogen and oxygen;

injecting a second source gas comprising a hydrocarbon into the chamber through second channels of the dual channel showerhead, wherein the hydrocarbon comprises one or more of an alkene, an alkyne, or an aromatic hydrocarbon;

reacting the reactive species with the second source gas to form $C_X H_Y$ radicals within the chamber; and etching the metal-containing material in the chamber, wherein etch byproducts comprise $C_X H_Y M$, wherein M is a metal selected from the group consisting of indium, tin, zinc and cadmium.

10. The method of claim 9, wherein the metal-containing material is a layer on a substrate.

11. The method of claim 9, wherein the metal is tin.

* * * * *